(12) United States Patent
Conner

(10) Patent No.: US 8,094,766 B2
(45) Date of Patent: Jan. 10, 2012

(54) TRACKER CIRCUIT AND METHOD FOR AUTOMATED TEST EQUIPMENT SYSTEMS

(75) Inventor: George W. Conner, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 823 days.

(21) Appl. No.: 12/167,073

(22) Filed: Jul. 2, 2008

(65) Prior Publication Data

US 2010/0002819 A1 Jan. 7, 2010

(51) Int. Cl.
*H04L 7/00* (2006.01)

(52) U.S. Cl. ........ 375/355; 375/232; 375/316; 327/156; 327/161; 714/718; 714/725

(58) Field of Classification Search ........... 375/232, 375/316, 371, 355; 327/156, 161, 162; 714/718, 714/725, 726, 728

See application file for complete search history.

(56) References Cited

U.S. PATENT DOCUMENTS

| | | |
|---|---|---|
| 5,173,617 A | 12/1992 | Alsup et al. |
| 5,297,173 A | 3/1994 | Hikmet et al. |
| 5,646,519 A | 7/1997 | Hamilton et al. |
| 5,754,606 A | 5/1998 | Matsuyama et al. |
| 5,982,827 A | 11/1999 | Duffner et al. |
| 6,324,485 B1 | 11/2001 | Ellis |
| 6,389,090 B2 | 5/2002 | Zortea et al. |
| 6,861,886 B1 | 3/2005 | Ludden et al. |
| 7,100,067 B2 | 8/2006 | Hansen et al. |
| 7,167,034 B2 | 1/2007 | Hirano |
| 7,209,531 B1 | 4/2007 | Katz et al. |
| 7,259,606 B2 | 8/2007 | Ku et al. |
| 7,260,493 B2 | 8/2007 | Laquai et al. |
| 2001/0014922 A1 | 8/2001 | Kuge |
| 2003/0091136 A1 | 5/2003 | Sugita |
| 2005/0219937 A1 | 10/2005 | Sato |
| 2005/0259556 A1 | 11/2005 | Doi |
| 2006/0280272 A1* | 12/2006 | Stojanovic ............ 375/355 |
| 2007/0146035 A1 | 6/2007 | Law et al. |

(Continued)

FOREIGN PATENT DOCUMENTS

EP 1686388 8/2006

OTHER PUBLICATIONS

Sivaram, A.T. et al., Tester Architecture for the Source Synchronous Bus, ITC International Test Conference, 0-7803-8580-2/04 IEEE, Paper 26.2, Oct. 2004, p. 738-747.

(Continued)

*Primary Examiner* — Khanh C Tran
*Assistant Examiner* — Fitwi Hailegiorgis
(74) *Attorney, Agent, or Firm* — Wolf, Greenfield & Sacks, P.C.

(57) ABSTRACT

A digital data signal capture circuit for synchronization of received digital data signals includes a transition detector for determining a state transition of the received digital data signal. The transition detector samples the received digital data signal at a first time, a second time and a third time and determines whether the transition occurs between the first time and the second time and whether it occurs between the first time and third time and generates an increment/decrement signal indicating a position for the transition. A strobe adjust circuit generates a strobe signal based on the increment/decrement signal. A capture circuit captures the received digital data signal using the strobe signal.

29 Claims, 7 Drawing Sheets

U.S. PATENT DOCUMENTS

2007/0204190 A1* 8/2007 Hesse et al. .................. 714/718
2007/0217559 A1* 9/2007 Stott et al. .................... 375/355
2008/0120059 A1 5/2008 Awaji et al.

OTHER PUBLICATIONS

Yamamoto, Kazuhiro et al., Multi Strobe Circuit for 2.133GHz Memory Test System, International Test Conference, 1-4244-0292-1/06 IEEE, Paper 6.1, Oct. 2006, p. 1-9.
PCT International Searching Autohrity/Korea, PCT International Search Report (ISR),Dec. 29, 2009.
PCT International Searching Autohrity/Korea, PCT Written Opinion of the International Searching Authority,Dec. 29, 2009.

* cited by examiner

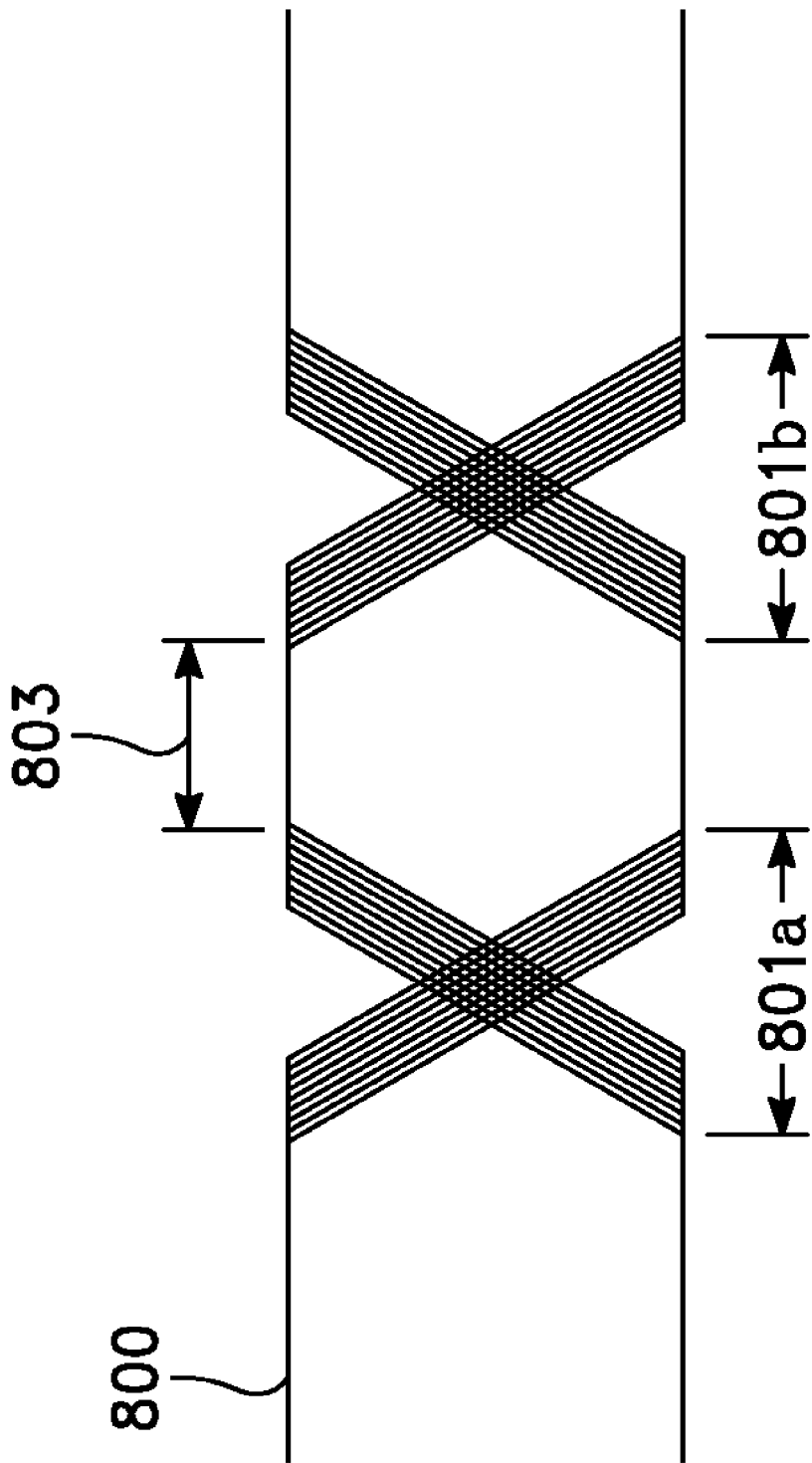

TRACKER CIRCUIT AND METHOD FOR AUTOMATED TEST EQUIPMENT SYSTEMS

BACKGROUND

An automated test equipment system is used for testing integrated circuit devices or ICs. That testing involves functional testing including time dependent data. The automated test equipment system, also referred to as an ATE tester, typically includes test circuitry that is connected to a control computer. The control computer provides a user interface that accepts and stores functional test patterns and timing data, referred to as test vectors for activating the test circuitry to provide stimulus signals to a device-under-test or DUT. This also includes receiving and evaluating DUT response output signals. The DUT output signals are evaluated to determine the parametric and operational characterization of the DUT. Stored pattern functional testing affords a critical step in the production of integrated circuit devices to provide parametric and operational characterization of the devices.

The present inventor has realized that the effectiveness of such testing relies on accurate synchronization of the tester and DUT. This is because as clock speeds increase to gigahertz and beyond, the effectiveness of the testing is dependent more heavily on precise clock synchronization. At high frequency, inaccuracy of clock and data synchronization can more easily result in false test results because the margins of error decrease as the operating speed of the device under test increases. As discussed below, this may occur because the data transition time or "jitter band" becomes a larger percentage of the data signal, thus creating a larger source of false test results.

What is needed is an apparatus and/or method for ensuring that the response data signal is correctly detected. Thus, it has been determined by the present inventor that what is needed is a means for synchronizing the tester clock signals with incoming DUT response data signals to allow detection of the response data signal away from the jitter band.

SUMMARY

In one embodiment, a digital data signal capture circuit that synchronizes a received digital data signal includes a transition detector. The transition detector has a digital data signal sampler and an early/late transition detector. The digital data signal sampler samples and holds the received digital data signal at a first time, a second time, and a third time. The early/late transition detector is in communication with the digital data signal sampler to receive samples of the received digital data signal at the first time, second time, and the third time and from the received samples determine if the state transition occurs between the first time and the second time and if the state transition occurs between the first time and the third time and from the time position of the state transition generates an increment/decrement signal indicating a position for the transition. A strobe adjustment circuit is in communication with the transition detector to receive the increment/decrement signal. From the increment/decrement signals, the strobe adjustment circuit generates the strobe signal based on the indication of the position of the transition. The digital data signal capture circuit includes a capture flip flop circuit that is coupled to receive the received digital data signal and is coupled to communicate with the strobe adjustment circuit to receive the strobe signal to capture the received digital data signal at the timing of the strobe signal.

The digital data signal sampler incorporates a first tracking flip flop, a second tracking flip flop, and third tracking flip flop. The first tracking flip flop captures and retains the received digital data signal at the first time and at the third time. The second tracking flip flop captures and retains the received digital data signal at the second time. The third tracking flip flop is in communication with the first tracking flip flop to receive the received digital data signal captured at the first time for storage until the third time.

The digital data signal capture circuit has a clock generator that generates a first timing signal and a second timing signal. The first timing signal has a phase difference of approximately 90° from the second timing signal. The clock generator is connected to provide the first timing signal at the first time and the third time to the first tracking flip flop to capture and retain the received digital data signal. The clock generator is connected to provide the first timing signal to the third flip flop to receive the received digital data signal captured at the first time for storage until the third time. The clock generator is connected to provide the second timing signal to the second flip flop at the second time to capture and retain the received digital data signal at the second time.

The early/late transition detector has a first comparison circuit in communication with the first and third flip flops to generate a transition occurrence signal to indicate that the transition occurred between the first time and the third time. The early/late transition detector further includes a second comparison circuit in communication with the second and third flip flops to indicate that the transition occurred between the first time and the second time.

The strobe adjustment circuit comprises a persistence up/down counter, a digital-to-analog converter, and a variable delay element. The persistence up/down counter is in communication with the transition detector via an OR tree to receive the increment/decrement signal and is constructed to increment the persistence up/down counter so as to adjust a strobe digital value signal. The digital-to-analog converter is in communication with the persistence up/down counter. The persistence up/down counter may be a programmable multiple bit counter adjusted to limit a repetition rate of the received digital data signal. The variable delay element is in communication with the digital-to-analog converter to adjust a master oscillator strobe signal to generate the strobe signal based on an output of the digital-to-analog converter. The variable delay element provides the strobe signal to the capture circuit for capturing the received digital data signal.

The digital data signal capture circuit further includes an OR tree circuit that is in communication with the transition detector. The OR tree circuit receives the increment/decrement signal for a set number of clock cycles per cycle of the received digital data signal to insure that the digital data signal capture circuit is not unstable and does not oscillate.

In various embodiments, the digital data signal capture circuit also includes a tracker controller. The tracker controller is in communication with a pattern generator to receive tracker control signal and in communication with the transition detector and the strobe adjustment circuit to position the strobe signal as a function of the tracker control signal.

In various embodiments, a digital data signal capture method is executed to synchronize received digital data signals. The method includes detecting transitions of a received digital data signal. Detecting the transitions includes sampling and holding the received digital data signal at a first time, a second time, and a third time. It is then determined whether a state transition has occurred between the first time and the second time and whether it has occurred between the first time and the third time. One of an increment signal or a decrement signal is generated to provide an indication of a position of the state transition between the first time and the second time or between the second time and the third time. A strobe signal is adjusted based on the increment signal and the decrement signal. A digital data signal state value of the received digital data signal is captured using the strobe signal.

The sampling of the received digital data signal at the first time, the second time, and the third time may include generating a first timing signal and a second timing signal. The first timing signal has a phase difference of approximately 90° from the second timing signal. The first timing signal is provided at the first time and the third time to capture and retain the received digital data signal. The first timing signal is connected to provide the first timing signal to receive the received digital data signal captured at the first time for storage until the third time. The second timing signal is provided at the second time to capture and retain the received digital data signal at the second time. Generating the strobe signal may include synchronizing the strobe with the received digital data signal such that digital data signal state value is detected midway between jitter bands of the received digital data signal.

BRIEF DESCRIPTION OF THE DRAWINGS

FIG. 8 shows and example of jitter bands in a digital data signal.

DESCRIPTION

The main limiting factor for the communication of fast data, which is transferred between two integrated circuits, is the clock to data setup and hold time on the receiving Flip-Flop, or latch. Several different methods may be used to deal with the capturing of data across the boundary between the two integrated circuits. One way of synchronization is to include sending clock simultaneously with the data on two separate transmission paths. This commonly referred to as source synchronization.

Another way is to embed the clock in the data by encoding the data with clocking with a protocol that allows the extraction of the clock from the data. Yet another way is using bidirectional communication protocols that provide "handshaking" feedback digital data signals to inform the transmitter that it needs to move the data transition relatively earlier or later to compensate for lack of synchronicity between the transmitting integrated circuit and the receiving integrated circuit.

The above techniques may be used alone or in combination to allow transfer of data between a device-under-test and an automated test equipment system.

Figure 1:
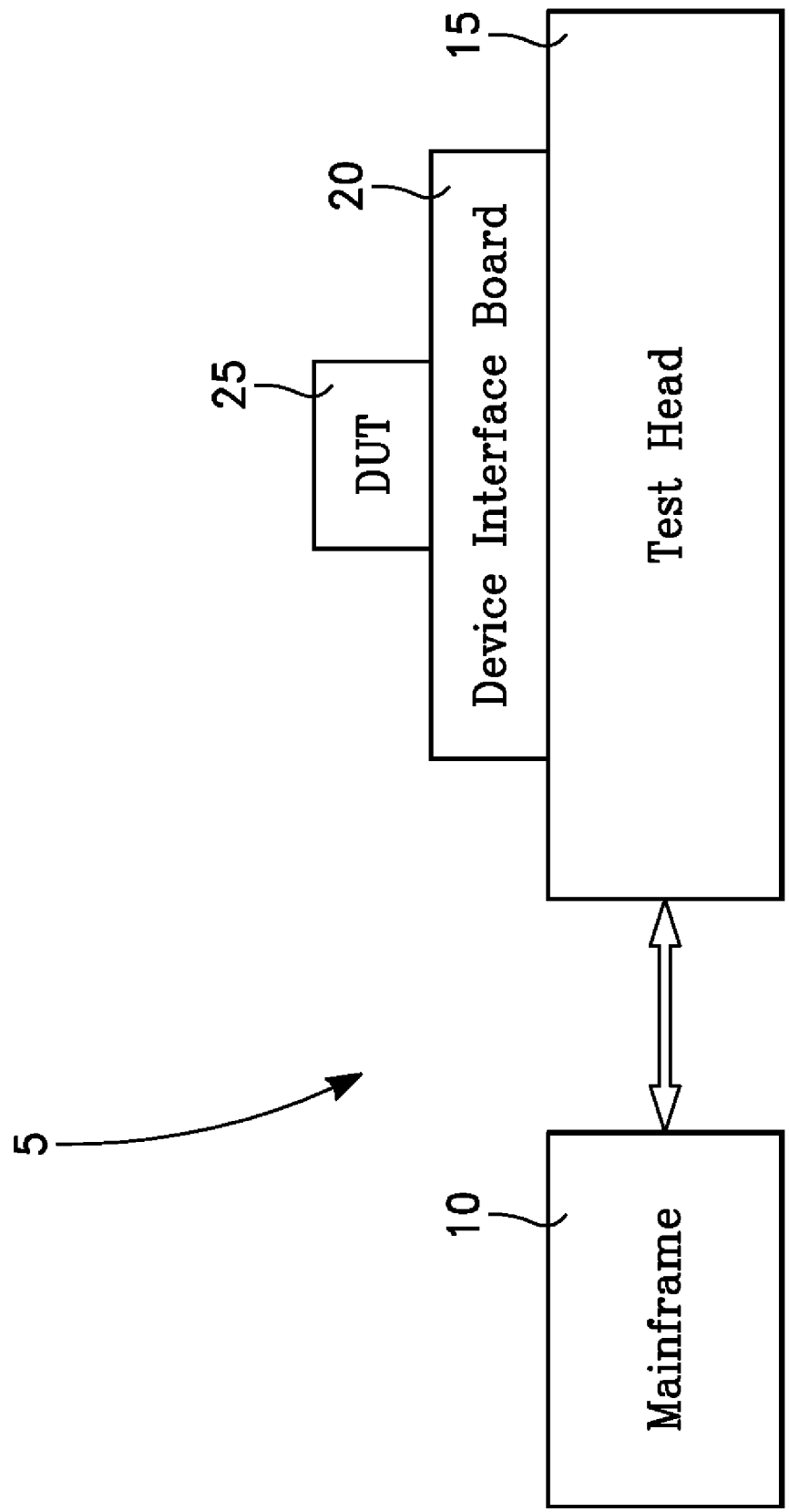
FIG. 1 is a simplified block diagram of an automated test equipment system.

FIG. 1 is a simplified block diagram of an example of an automated test equipment system 5. The automated test equipment 5 includes a control computer (not shown) typically in the tester mainframe 10, which is in communication with a test head 15. The test head 15 is connected to a device interface board or DIB 20. The DIB 20 electrically contacts the DUT 25 for testing the device under test. The device-under-test 25 may be a packaged silicon die, or a semiconductor wafer containing many chips for probe testing.

The automated test equipment system 5 includes test circuitry (not shown) for generating stimulus signals and evaluating response signals from the DUT 25. This circuitry (not shown) may include power; signal pattern, format, and timing generators; pin electronics; and input/output drivers, some of which is located in the test head 15 and some in the tester mainframe 10, depending on the embodiment. Further, this circuitry (not shown) may include signal capture and evaluation circuitry.

Figure 2:
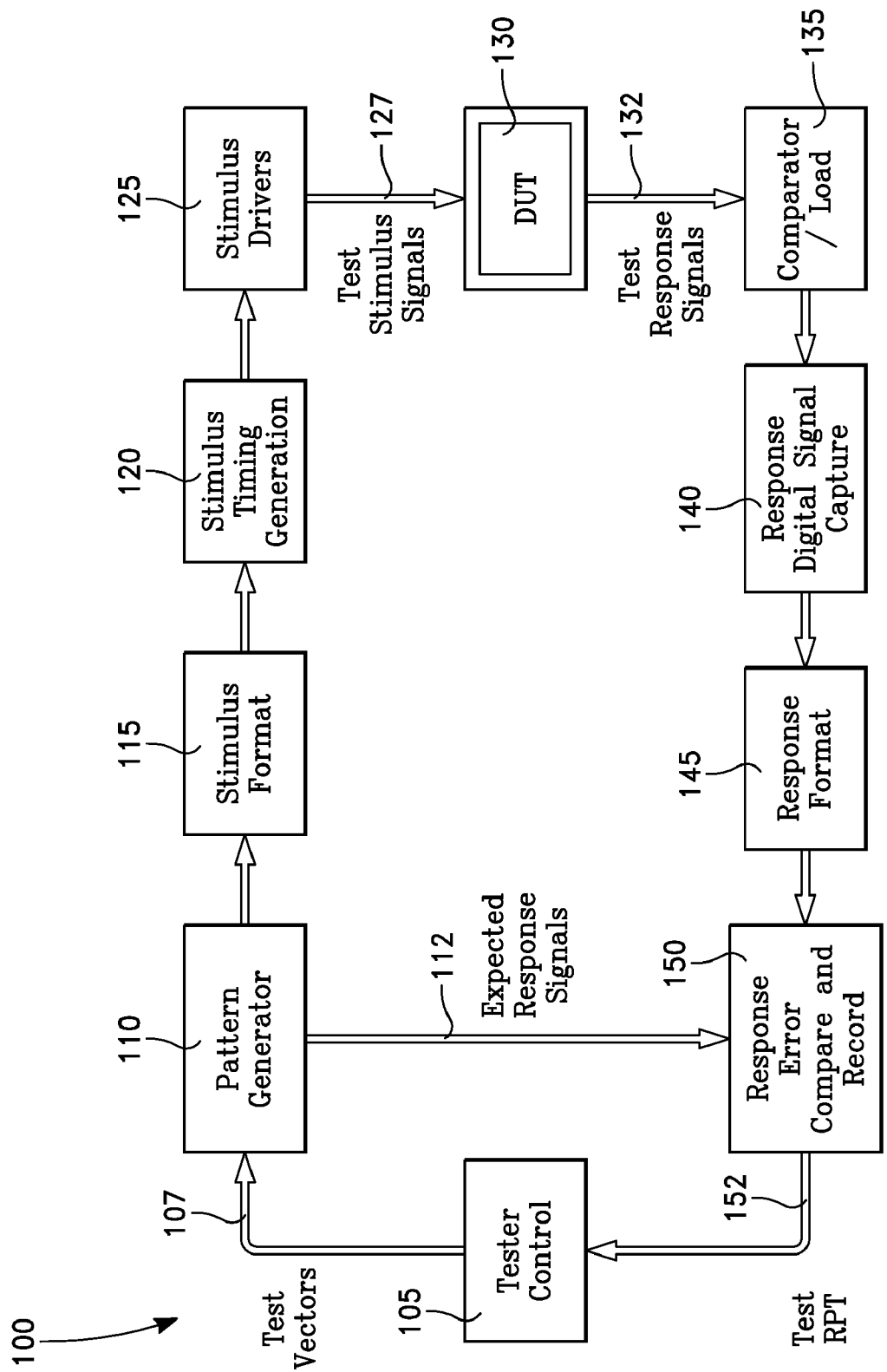
FIG. 2 is a simplified block diagram of an automated test equipment system channel to a device-under-test.

FIG. 2 is a simplified block diagram of one possible example embodiment of an automated test equipment system channel to a device-under-test. The automated test equipment 100 has a tester control unit 105 that provides overall functional control for parametric and functional testing of a device-under-test 130. The definition of the parametric and functional testing is described in test vectors 107 that are dispatched to the individual channels that provide the stimulus input test signals and monitor the response output signals of the device-under-test 130. The test vectors 107 are transferred to a test pattern generator 110. The test pattern generator 110 decodes the test vectors 107 to determine the specific pattern of stimulus test signals for each channel and thus for each input or output pin of the device-under-test 130. The output of the test pattern generator 110 is the stimulus test signal formatter 115. The stimulus test signal formatter 115 receives the generated test stimulus signals and formats the signals for correct voltage amplitude and sequence for ordered test vectors. The output of the stimulus test signal formatter 115 is the test stimulus signal timing generator 120. The test stimulus signal timing generator 120 adjusts the timing of the stimulus test signals such that they are correctly aligned to meet the timing specifications of the device-under-test 130. The output of the test stimulus signal timing generator 120 is the input to the test stimulus signal drivers 125. The test stimulus signal drivers 125 provide the appropriate source impedance and driving current and voltage to meet the input requirements of the device-under-test 130. The test stimulus signals 127 from the test stimulus signal drivers 125 are applied to the device-under-test 130.

The test response signals 132 are the signals generated by the device-under-test 130 in response to the inputs of the test stimulus signal drivers 125 and are the inputs to the test response comparator/load circuits 135. The test response comparator/load circuits 135 provide the appropriate termination load devices for the transmission lines (printed circuit lands, connectors, and cables) that carry the test response signals 132. The test response comparator/load circuits 135 further has comparator circuits for determining a voltage state of the test response signals 132. If the test response signals 132 are digital data signals, this is the logical 1 or logical 0 or the logic state. Alternately, if the test response signals 132 are analog signals the comparators may in fact be analog-to-digital converters for sampling the analog test response signals 132 for further evaluation.

The recovered test response signals 132 are transferred from the test response comparator/load circuits 135 to the response digital data signal capture circuit 140. The response digital data signal capture circuit 140 establishes the timing of the recovered test response signals 132 to insure that the test response signals 132 are correctly received relative to the timing of the automated test equipment system 100. The test response signals 132 are then transferred to the test response signal format recovery circuit 145. The test response signal format recovery circuit 145 interprets the format of the test response signals 132 to insure that the format of the test response signals 132 is correctly interpreted. The test response signals 132 are then conveyed to the test response signal error compare and recording circuit 150. The test response signal error compare and recording circuit 150 receives an expected response signal 112 from the test pattern generator 110 for comparison to the recovered, timed, and formatted test response signals 147. The outcome of the comparison is compiled to become a test result report 152 that is conveyed to the tester control unit 105 for further processing and evaluation. The tester control unit 105 may include control function circuits (not shown) such as a shmoo plot generator for providing control signals to the function blocks 110, 115, 120, 125, 135, 140, 145, and 150 to modify the timing of the test stimulus signals 127 and capturing of the test response signals 132.

In the automated test equipment systems 100, the test response signals 132 may be structured to have the source synchronized digital data, the digital data with the embedded clock, or the digital data with the bidirectional communication protocols that provide "handshaking" feedback data as described above. Additionally, any newly designed data transfer protocols are going to be received and require synchronization to enable the reception of test response signals 132. Rather than implement specific solutions to each form of clock for data skew management for each application, what is needed is to implement a general solution that should be able to synchronize any transfer of digital data signals (i.e. data and/or clock) from a device-under-test 130 with the integrated circuits of the automated test equipment 100. Further what is needed is to provide a circuit that actually tracks the incoming digital data signal transitions and based on the transition tracking adjusts a strobe in the center of the digital data signal eye no matter what type of data protocol and clocking scheme is employed. The digital data signal eye being a boundary between jitter bands of successive digital data signals.

FIG. 8 shows an example of jitter bands in a digital data signal. The jitter bands 801a and 801b are fluctuations at the transitions of successive transitions of the digital data signal 800 relative to the nominal cycle time of the digital data signal 800. Obtaining reliable data in the digital data signal eye 803 or between the jitter bands can be a significant problem at high frequencies, i.e. at frequencies of about 1 Ghz (1 Gbps) or greater, because the jitter bands occupy a larger relative percentage of the digital data signal 800.

In various embodiments, a digital data signal capture circuit determines an occurrence of a transition of the digital data signals. It should be noted that the term digital data signals refers to any data or clock signal being captured and synchronized by all embodiment of the digital data signal capture circuit. The digital data signal capture circuit then detects if the transition was earlier or later than expected relative to the clock of the receiving circuitry. A strobe signal timing position of the clock is then moved in the same direction.

Figure 3:
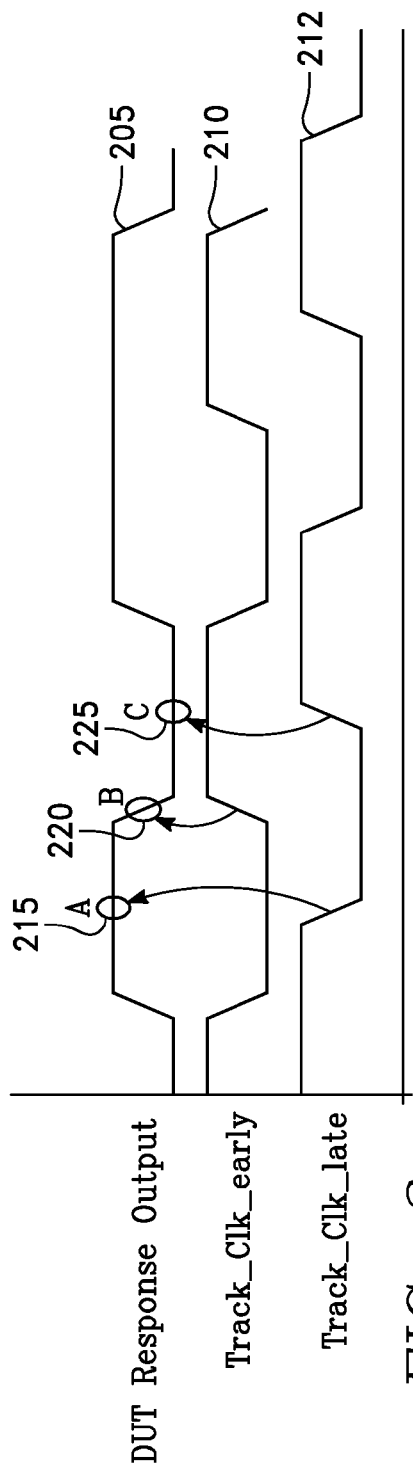
FIG. 3 is a plot of an example DUT digital output signal and the automated test equipment timing clocks used for capturing and synchronizing the DUT digital output signal of various embodiments.

FIG. 3 is a plot of a device-under-test (DUT) response digital data signal output and the automated test equipment timing clocks used for capturing and synchronizing the response digital data signal of a DUT for various embodiments. The DUT digital response signal output 205 is the response from the DUT to the stimulus test signals 127 of FIG. 2. The tester control unit 105 of FIG. 2 generates tracking clocks, Track_Clk_early 210 and Track_Clk_late 212 that are approximately 90° out of phase. With the falling edge of the Track_Clk_early 210 arriving approximately one quarter (¼) cycle earlier than the Track_Clock_late 212. Each of the tracking clocks, Track_Clk_early 210 and Track_Clk_late 212 are used to sample the digital response signal output 205. The digital response signal output 205 is sampled at the time A 215 by the falling edge of the Track_Clock_late 212. The digital response signal output 205 is sampled at the time B 220 by the rising edge of the Track_Clock_early 210. The digital response signal output 205 is sampled at the time C 225 by the rising edge of the Track_Clock_late 212.

The digital logic states at the time A 215 and at the time C 225 are logically compared to determine if a transition occurred in the time period between the sampling at the time A 215 and at the time C 225. The digital logic states at the time A 215 and at the time B 220 are logically compared to determine if a transition occurred in the time period between the sampling at the time A 215 and at the time B 220. If the logic states of the digital response signal output 205 at the time A 215 and at the time C 225 are different (a transition occurred) and if the logic states of the digital response signal output 205 at the time A 215 and at the time B 220 are the same (transition is late), the strobe clock transition position must be placed at a later time. Alternately, if the logic states of the digital response signal output 205 at the time A 215 and at the time C 225 are different (a transition occurred) and if the logic states of the digital response signal output 205 at the time A 215 and at the time B 220 are different (transition is early), the strobe clock transition position must be placed at an earlier time. The moving of the strobe clock transition position synchronizes the strobe clock with the digital response signal output 205 such that the digital data signal state value of the digital response signal output 205 is detected midway between jitter bands of the digital response signal output 205.

Figure 4:
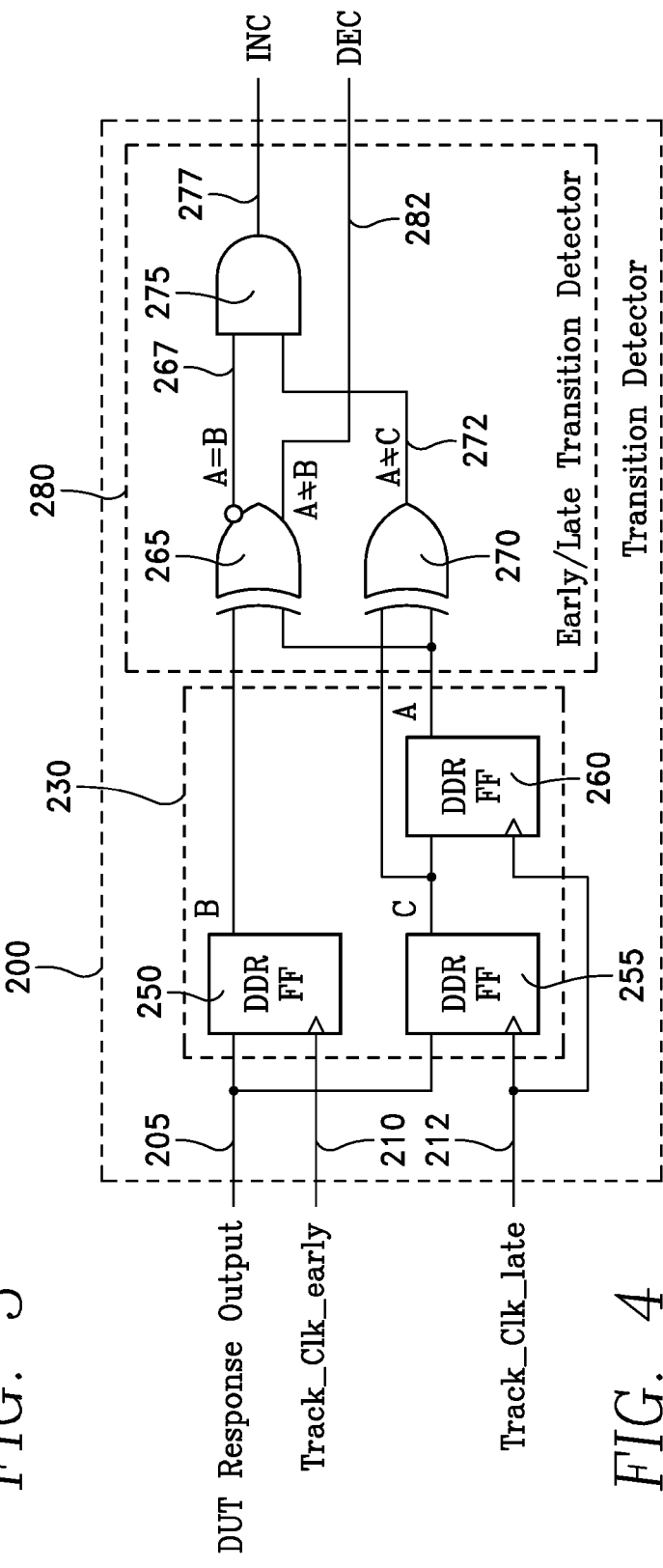
FIG. 4 is a logic diagram of some embodiments of a transition detection circuit for digital data signal capture.

FIG. 4 is a logic diagram of a digital data signal transition detection circuit 200. In this embodiment, the transition detector 200 detects a state transition of the received digital data signal. The digital response signal output 205 is received by a digital data signal sampler circuit 230 from the output of the test response comparator/load circuits 135 of FIG. 2. The digital data signal sampler circuit 230 samples and holds the digital response signal output 205 and includes the double repetition rate (DDR) flip flops 250, 255, and 260. The double repetition rate (DDR) flip flops 250 and 255 receive the digital response signal output 205. The DDR flip flop 250 is clocked by Track_Clock_early 210 and the DDR flip flop 255 is clocked by the Track_Clock_late 212. The rising edge of the Track_Clock_early 210 triggers the DDR flip flop 250 to sample and hold the digital response signal output 205 at the time B 220. The falling edge of the Track_Clock_late 212 triggers the DDR flip flop 255 to sample and hold the digital response signal output 205 at the time A 215.

The output of the DDR flip flop 255 is connected to the data input of the DDR flip flop 260. The Track_Clock_late 212 is the input to the clock terminal of the DDR flip flop 260.

The rising edge of the Track_Clock_late 212 triggers the DDR flip flop 260 to transfer the sampled and held digital response signal at the output of the DDR flip flop 255 at the time C 225 to the DDR flip flop 260. At the same time the rising edge of the Track_Clock_late 212 triggers the DDR flip flop 255 to sample and hold the digital response signal output 205 at the time C 225.

An early/late transition detector 280 is connected with the digital data signal sampler 230 to receive samples of the received digital data signal (outputs A, B, and C). The early/late transition detector 280 includes the Exclusive OR circuits 265 and 270 and the AND gate 275. The Exclusive OR circuit 265 logically compares the sampled and held digital response signal B at the output of the DDR flip flop 250 with the sampled and held digital response signal at the output A of the DDR flip flop 260 to determine if a transition has occurred between the time A 215 and the time B 220. The Exclusive OR circuit 270 logically compares the sampled and held digital response signal C at the output of the DDR flip flop 255 with the sampled and held digital response signal at the output A of the DDR flip flop 260 to determine if a transition has occurred between the time A 215 and at the time C 225. The AND gate 275 logically combines the signal 267 indicating that the logic state of the digital response signal output 205 at the time A 215 is equal to the logic state of the digital response signal output 205 at the time B 220 (A=B) with the signal 272 indicating the a transition has occurred between the time A 215 and the time C 225 (A≠C) to provide an increment signal 277 indicating that the strobe should be moved later to capture the digital response signal output 205. The out-of-phase output of the Exclusive OR circuit 265 that indicates that the logic state of the digital response signal output 205 at the time A 215 is not equal to the logic state of the digital response signal output 205 at the time B 220 (A≠B) provides a decrement signal 282 indicating that the strobe should be moved later to capture the digital response signal output 205.

Figure 5:
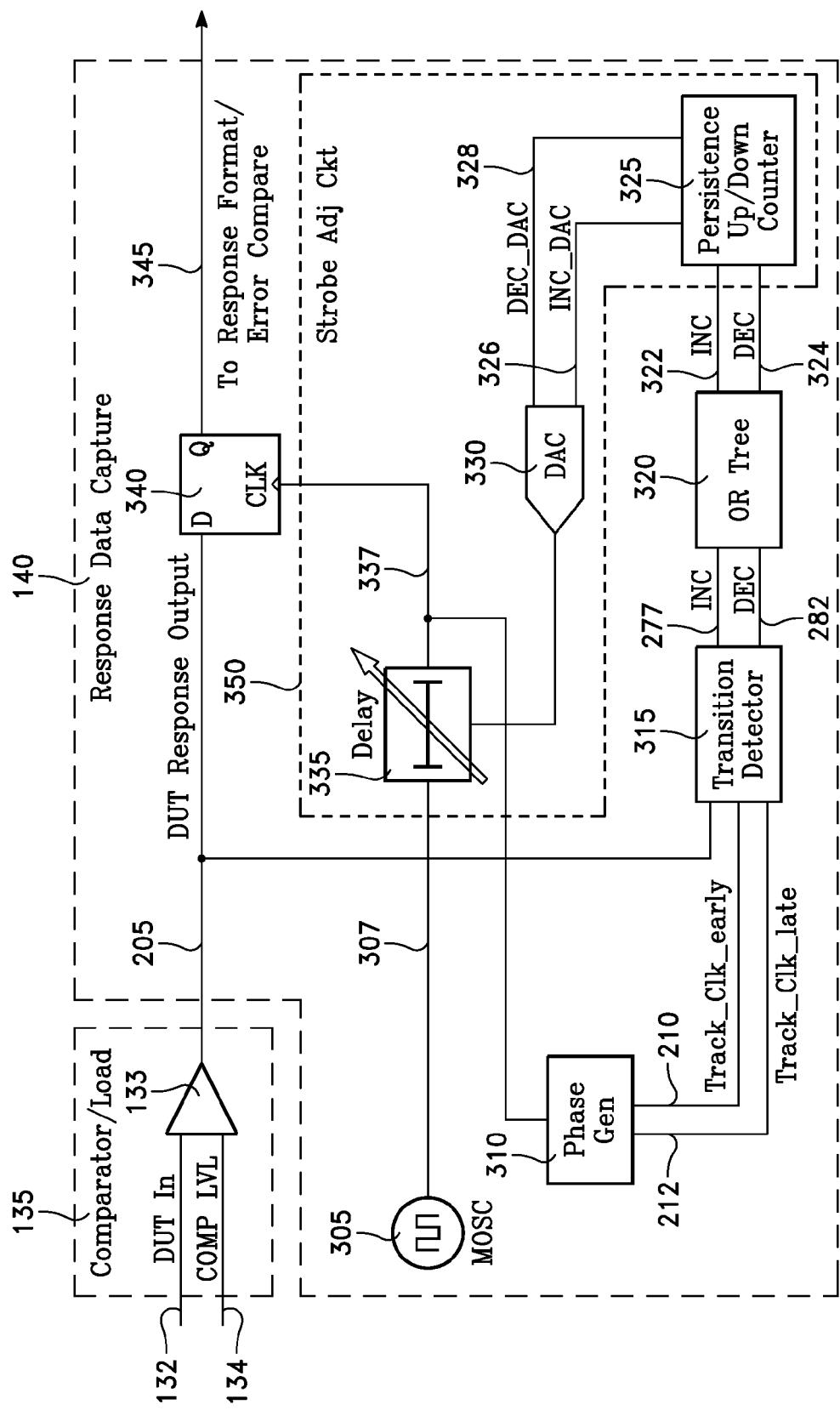
FIG. 5 is a simplified block diagram of an embodiment of a data capture circuit for capture of DUT digital output.

FIG. 5 is a block diagram of an embodiment of a response digital data signal capture circuit 140. The test response signal 132 is applied to the comparator/load circuit 135, as shown in FIG. 2. The comparator/load circuit 135 receives a comparator level signal 134 indicating a level demarcating the logic state levels of the test response signal 132. A comparator circuit 133 determines the logic state level of the test response signal 132 and generates the digital response signal output 205 that is the input to the response digital data signal capture circuit 140.

The response digital data signal capture circuit 140 has a master oscillator 305, labeled as MOSC in FIG. 5, that generates the master strobe clock 307 that used to capture the digital response signal 205. The master strobe clock 307 is an input to the strobe adjust circuit 350. The strobe adjust circuit 350 includes the delay element 335 that advances or delays the strobe clock 307 to generate the adjusted strobe clock 337 that is the input to a data capture circuit, such as a flip flop 340. This may be done on a per channel basis, i.e. the strobe clock 337 for each channel of the tester may be adjusted independently, or a single channel may be used to adjust the strobe clock 337 used by all channels of the tester.

The adjusted strobe clock 337 is applied to the phase generator 310 that generates the Track_Clock_early 210 and the Track_Clock_late 212. The Track_Clock_early 210 and the Track_Clock_late 212 are the timing inputs to the transition detector 315. The transition detector 315 is structured and performs as described in FIG. 4. The digital response signal 205 is applied to the transition detector 315 along with the Track_Clk_early 210 and Track_Clk_late 212, as discussed above with reference to FIG. 4. The transition detector 315 indicates whether a transition of the digital response signal output 205 is early or late, and thus indicates whether the strobe clock 307 needs to be advanced or delayed for capturing the digital data signal 205 to generate the digital response signal 345 which is transferred through the test response signal format recovery circuit 145 to the test response signal error compare and recording circuit 150 of FIG. 2.

The strobe adjust circuit 350 further includes the persistence UP/DOWN counter 325 and the digital-to-analog converter 330. The adjustment voltage for the delay element 335 is the analog output voltage of the digital-to-analog converter 330. The increment command INC_DAC 326 and the decrement command DEC_DAC 328 applied to the inputs of the digital-to-analog converter 330 is the output of the persistence UP/DOWN counter 325. The value of the increment command INC_DAC 326 and the decrement command DEC_DAC 328 outputs of the persistence UP/DOWN counter 325 are based on the timing of the transition of the digital response signal 205 as determined by the transition detector 315. The strobe position is set with digital-to-analog converter 330 in which larger values provides more delay in the delay element 335 move the strobe later and smaller values provide less delay in the delay element 335 to move the strobe earlier.

Several problems arise from using just the transition detector 315: First, in current and future applications, the strobe may be running at extremely high frequencies of 8 GHz or more. It is very difficult to implement a persistence UP/DOWN counter 325 that can operate with random increment and decrement signals at this high operational frequency. Second, there is a loop time for the circuit to respond to changes in position of the strobe. The digital data signal capture may become unstable and oscillate as it is trying to correct. To address this, the increment output 277 and decrement output 282 are applied to the OR tree circuit 320. The extremely high clock frequencies and the potential instabilities and/or oscillations are managed by the OR tree circuit 320. The increment output 322 and decrement output 324 of the OR tree circuit 320 control the persistence UP/DOWN counter 325 driving the digital-to-analog converter 330.

Third, in many cases the digital data signal capture circuit is used on an I/O boundary that is alternately an input and an output, for instance the data pins of a memory both transmit and receive data. The digital data signal capture circuit 140 must be disabled when the automated test equipment 100 is providing the stimulus signals to a device-under-test. A DC enable function would be implemented on the Drive I/O signal to appropriately enable or disable the digital data signal capture circuit 140.

Figure 6:
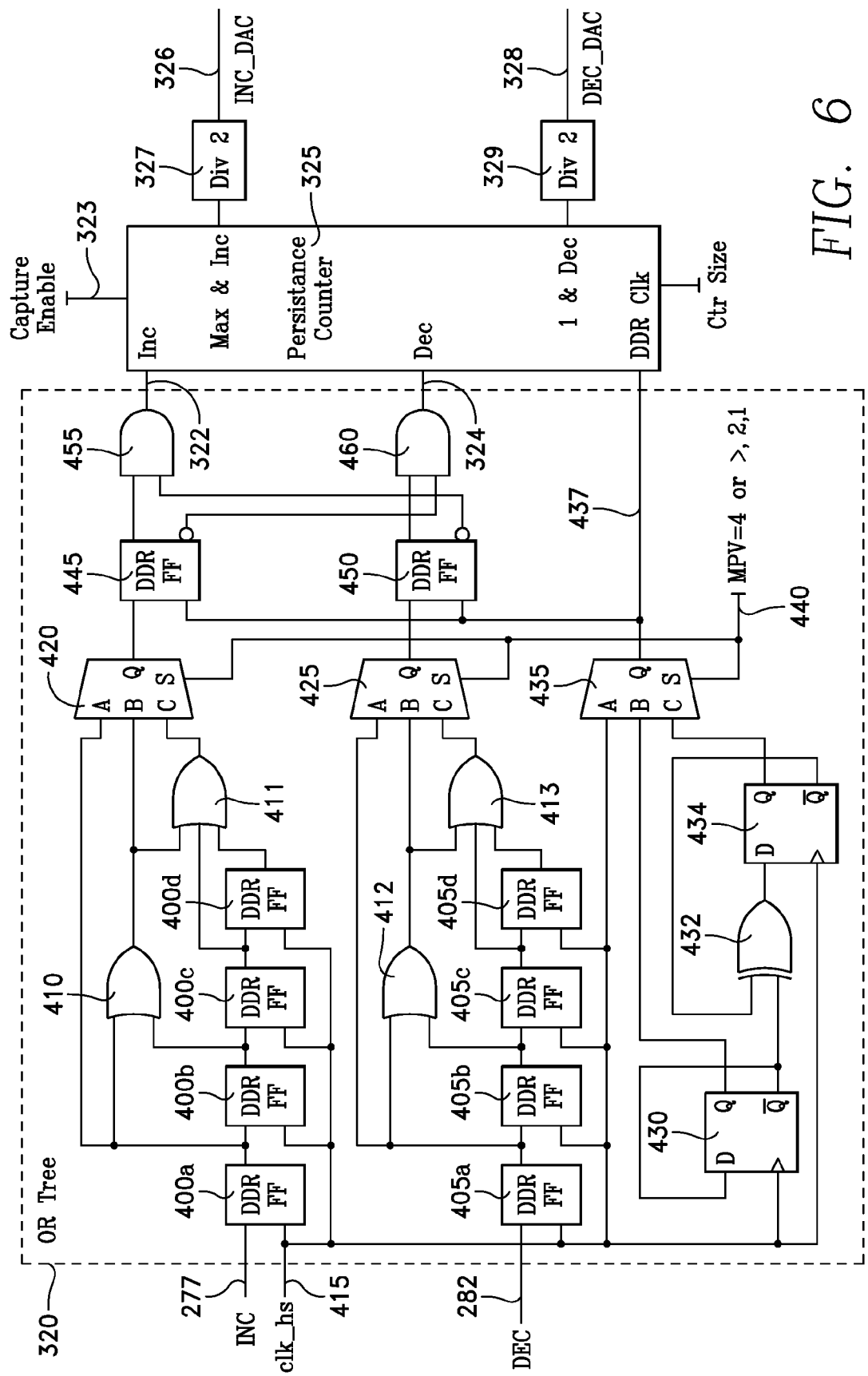
FIG. 6 is a logic diagram of one embodiment of an OR tree circuit and persistence up/down counter.

FIG. 6 is a logic diagram of an OR tree circuit 320 and persistence up/down counter 325 of one embodiment. The OR tree circuit 320 consists of two strings of DDR flip flops 400a, 400b, 400c, and 400d, and 405a, 405b, 405c, and 405d. The outputs of the DDR flip flops 400a and 400b are connected to the OR gate 410 and the outputs of the DDR flip flops 400c and 400d and the output of the OR gate 410 are connected to the OR gates 411. The outputs of the DDR flip flops 405a and 405b are connected to the OR gate 412 and the outputs of the DDR flip flops 405c and 405d and the output of the OR gate 412 are connected to the OR gates 413. The clock clk_hs 415 is applied to the clock input of each of the DDR flip flops 400a, 400b, 400c, and 400d, and 405a, 405b, 405c, and 405d. The increment signal 277 from the transition detector 315 of FIG. 5 is applied to the data input of the DDR flip flop 400a with the output of each of the DDR flip flops 400a, 400b, 400c applied to the data input of the DDR flip flops 400b, 400c, and 400d, respectively. The DEC 282 from the transition detector 315 of FIG. 5 is applied to the data input of the DDR flip flop 405a with the output of each of the DDR flip flops 405a, 405b, 405c applied to the data input of the DDR flip flops 405b, 405c, and 405d, respectively.

The output of the DDR flip flop 400a and the outputs of the OR gates 410 and 411 are the applied to the inputs of the multiplexer 420. The output of the DDR flip flop 405a and the outputs of the OR gates 412 and 413 are the applied to the inputs of the multiplexer 425.

The clock clk_hs 415 is applied to the data flip flops 430 and 434. The out-of-phase output of the data flip flop 430 is connected to its data input. Additionally, the out-of-phase output of the data flip flop 430 is connected to the input of the exclusive OR 432. The out-of-phase output of the data flip flop 432 is connected to the second input of the exclusive OR 432 and the output of the exclusive OR 432 is connected to the data input of the data flip flop 434. This structure provides a circuit that divides the clock clk_hs 415 by factors of two and four. The clock clk_hs 415, the in-phase output of the data flip flop 430, and the in-phase output of the data flip flop 434 are connected to the inputs of the multiplexer 435. The select gate lines of the multiplexers 420, 425, and 435 have the master oscillator cycles per vector select signal MPV 440 applied to select the number of sampling cycles applied for each of the DUT clock cycles. In this implementation there may be either 4, greater than 4, 2, or 1 sampling cycles for each DUT clock cycle.

The output of the multiplexer 420 is the data input to the data flip flop 445, and the output of the multiplexer 425 is the data input to the data flip flop 450. Thus, the output of the OR gates 410 and 411 of the increment branch of the OR tree circuit 320 are coupled to the DDR flip flop 445 via the multiplexer 420, and the output of the OR gates 412 and 413 of the decrement branch of the OR tree circuit 320 are coupled to the DDR flip flop 450 via the multiplexer 420. The clock inputs of the data flip flops 445 and 450 are clocked with the divided clock 437 from the output of the multiplexer 435. The outputs of the DDR flip flops 445 and 450 are the inputs to the AND gates 455 and 460. The non-inverting outputs of the DDR flip flops 445 and 450 are the inputs to the AND gates 455 and 460, respectively, and inverting outputs of the DDR flip flops 445 and 450 are the inputs to the AND gates 460 and 455, respectively. The logical combinations of the outputs of the data flip flops 445 and 450 generate the increment signal 322 and decrement signal 324 at the outputs of the AND gates 455 and 460. The increment signal 322 and decrement signal 324 are the command signs for the persistence counter 325 to activate an increment of the count or a decrement of the count.

At the fastest repetition rate (div 4), four cycles of the increment signal 277 are logically combined with the OR gates 410 and 411 and OR gates 412 and 413 and clocked respectively to the data flip flops 445 and 450 in the center with clock clk_hs 415 divided by four. If there are both increment and decrement commands in each group of four cycles, they cancel each other out and no action takes place at the persistence Up/Down counter 325. This, of course, is not ideal in that information may be lost, i.e. three increment signals 277 can be canceled out by one decrement signal. However, simulations of this situation have proven that the digital data signal capture is accurate. After the increment signal 277 has passed through and been processed by the OR tree circuit 320 to generate the increment signal 322, the repetition rate has been further slowed (to approximately 2 G bits per second (2 Gbps) max in some implementations). The slower increment and decrement signals 322 and 324 are used as input signals for the persistence Up/Down counter 325 for further repetition rate reduction. The outputs of the persistence Up/Down counter 325 are further divided in frequency by the divider circuits 327 and 329 to produce the INC_DAC 326 and DEC_DAC 328 signals. In the present implementation this allows a digital data signal strobe clock 337 of FIG. 5 to capture the digital data signals from the DUT at a rate of approximately 500 Mbps or below for digital data signal transfer between chips.

Returning to FIG. 5, the implementation of the persistence Up/Down counter 325 is a programmable three or four bit Up/Down counter. The persistence Up/Down counter 325 keeps track of the relative number of increment 322 and decrement 324 signals. If the persistence Up/Down counter 325 achieves the maximum count and another increment signal 322 arrives, the persistence Up/Down counter 325 is reset to the midpoint and issues an increment command INC_DAC 326 to the strobe digital-to-analog converter 330. If the persistence Up/Down counter 325 decrements to 1 and another decrement command 324 arrives, the persistence Up/Down counter 325 is reset to a midpoint value and the persistence Up/Down counter 325 issues a decrement command DEC_DAC 328. If the persistence Up/Down counter 325 is programmed to be three bits, it effectively divides the max repetition rate by a factor of four and if the persistence Up/Down counter 325 is a four bit counter, it divides the maximum repetition rate by a factor of eight. This allows the max repetition rate off chip to be limited to 250 Mbps. Future implementations may need to capture digital data signal at clocking rates of 12 GHz. In this case, the 4 bit counter would yield a max repetition rate of 375 Mbps. Besides reducing the off chip repetition rate, persistence Up/Down counter 325 serves as part of the loop bandwidth control. The larger count value of the persistence Up/Down counter 325 will reduce the slew rate by a factor of two. Normally the smallest count value that keeps the digital data signal rate in range is used, however, if there are stability problems the larger count value of the persistence Up/Down counter 325 is available.

In some embodiments used on a tester I/O channel, it may not be desirable to track, or adjust the strobe signal, while the tester is driving or sending signal to the DUT. In such a case, the persistence counter 325 may be disabled using the capture enable signal 323 when an I/O channel driver is on.

The embodiments of the response digital data signal capture circuit 140 of FIG. 5 illustrate a single path for capturing digital data signals. However, in embodiments of automated test equipment, the digital data signal capture 140 circuit may employ the phase generator 310, transition detect circuit 315, and the OR tree circuit 320 for the capture of digital data signals in multiple input channels of an automated test equipment system connected to a DUT. The increment signal output INC 322 and the decrement signal output DEC 324 of a single channel may be transferred to multiple digital-to-analog converters 330 on other digital data signal capture circuits 140.

Figure 7:
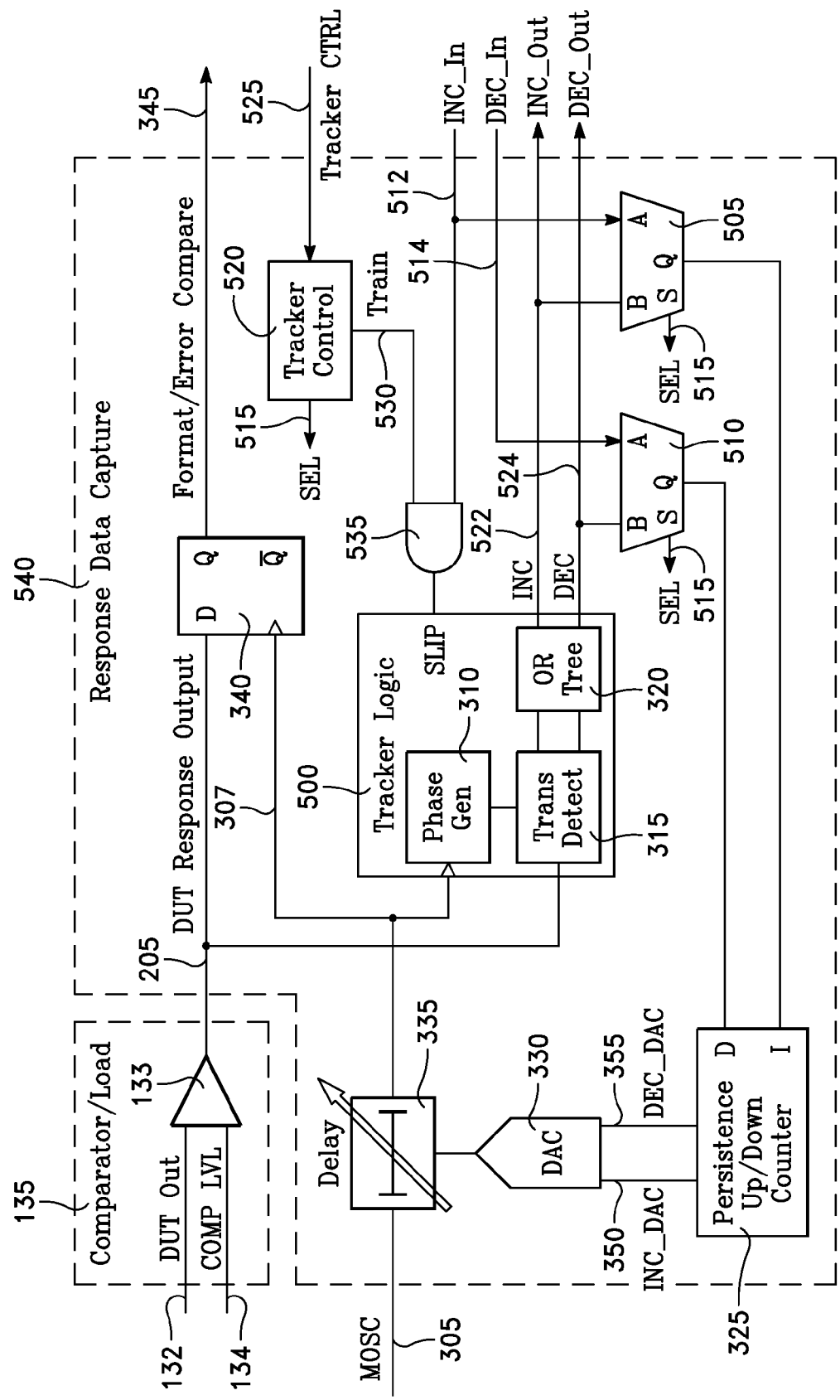
FIG. 7 is a block diagram of another embodiment of a data capture circuit for capture of DUT digital output.

FIG. 7 is a block diagram of a response digital data signal capture circuit 140 of another embodiment where the phase generator 310, the transition detect circuit 315, and the OR tree circuit 320 of the digital data signal capture circuit 140 are employed for providing the increment signal output INC 522 and the decrement signal output DEC 524 to multiple digital data signal capture circuits 140n of an automated test equipment system. The phase generator 310, the transition detect circuit 315, and the OR tree circuit 320 of the digital data signal capture circuit 140 are collectively referred to as a tracker logic circuit 500 for ease of discussion. The phase generator 310, the transition detect circuit 315, and the OR tree circuit 320 operate as in FIG. 5.

The increment output 522 and the decrement output 524 of the OR tree circuit 320 of the tracker 500 may be brought to the boundary of the response digital data signal capture circuit 540 for transfer to other response digital data signal capture circuits 540n (not shown) of other channels of the automated test equipment. The increment output 522 is applied to one input of the multiplexer 505 and the decrement output 524 is applied to one input of the multiplexer 510. An increment input 512 and a decrement input 514 is applied to the response digital data signal capture circuit 540 from other response digital data signal capture circuit 540 of other input channels of the automated test equipment. The increment input 512 is applied to a second input of the multiplexer 505 and the decrement input 514 is applied to the second input of the multiplexer 510.

The output of the multiplexer 505 and the output of the multiplexer 510 are respectively connected to the increment input and the decrement input of the persistence Up/Down counter 325. The multiplexers 505 and 510 act to select whether the advancing or delaying of the master strobe clock 307 is determined by the external increment input 512 and decrement input 514 applied to the response digital data signal capture circuit 540 from other channels within the automated test equipment system, or by the increment output 522 and the decrement output 524 from the tracker 500 of the channel, as shown.

The persistence Up/Down counter 325, the strobe digital-to-analog converter 330, the delay element 335, and capture flip flop 340 function as described in FIG. 5, except that, if an external increment input 512 and decrement input 514 are chosen for capturing the DUT response output digital data signal 205, the master strobe clock 307 may be varied according to the transitions of an other DUT digital response output signal 205n of other channels of the automated test equipment.

In some embodiments, the external increment input 512 and decrement input 514 may be from a shmooing generator as described within the tester control unit 105 of FIG. 2. The shmooing generator provides the increment input signal 512 and decrement input signal 514 to move the strobe signal to find the timing boundaries for successful capturing the DUT digital response signal output 205.

The select signal 515 is generated by the tracker control circuit 520. The tracker control signals 525, labeled as Tracker CTRL in FIG. 7, are sourced from the pattern generator 110 of FIG. 2. The tracker control signals 525 may have 4 bits to control the functions of enable, reset, select other channel, and train mode select. The enable signal causes all enabled transition detector tracker logic circuits 500 on all the channels to begin issuing the increment commands on the increment output 522 and decrement commands on the decrement output 524 to follow the DUT digital response output signal 205 of all the output signals of the DUT. The reset command causes all persistence Up/Down counter 325 of all the channels to return to the reset value. The reset value is a DC programmable value for each counter. The select other channel causes all enabled increment multiplexers 505 and the decrement multiplexers 510 to switch from the local increment output signals 522 and the local decrement output signals 524 to the external increment input signals 512 and the decrement input signals 514. The select other channel function is primarily used for tracking response data busses with a separate reference clock transmitted from the DUT. Only the input channel on which this separate clock is being received will remain using the local signals, all other persistence Up/Down counters 325 of the other channels will receive the increment and decrement commands as the increment input 512 and decrement input 514 from the channel receiving the separate clock. The control functions for the automated test equipment contains logic that allows any of the receiving response channels to be the source of increment and decrement commands as the increment input 512 and decrement input 514 and all other associated channels of the automated test equipment will follow.

The train mode enables the increment output 522 to cause the decrement output 524 to force the persistence Up/Down counter 325 to slip by the period of a clock (M4) that has a frequency that is one-quarter that of the master oscillator 305. The train mode command as one of the tracker control signals 525 causes the tracker control circuit to activate the train signal 530. The train signal 530 is one input of the AND gate 535. The second input of the AND gate 535 is the increment input 512. The logical combination of the train signal 530 and the increment input 512 generates the necessary decrement output signal 524 for forcing the slipping of the persistence Up/Down counter 325.

The train mode is used to position the master strobe clock 307 in the center of the delay range of the master strobe clock 307 on initial device alignment. The logical combination of the train signal 530 and the increment input 512 also issues a reset to re-center the digital-to-analog converter 330. The Train mode is only applied where the master oscillator cycles per vector select signal MPV 440 of FIG. 6 are set to factors of 2, 4 or 8. Master oscillator cycles per vector select signal MPV 440 set to a factor of one is always centered as is discussed hereinafter.

Shmooing or shmoo plotting of the response of the tester to variations in strobe placement may be implemented as a variation of the train mode. Shmooing is used to find an edge by moving the strobe along until the comparator goes from failing to passing. A shmooing generator, within the tester control unit 105 of FIG. 2 would issue successive increment or decrement commands so that the strobe position is moved by a desired amount. Shmooing commands may be implemented through tracker control 520. Since the enable and train mode bits of the tracker control signal 525 are not used when shmooing, they may be used as the increment and decrement bits for shmooing. As an alternative, the increment and decrement shmooing commands could be delivered to the multiplexers 505 and 510.

In various embodiments, the persistence Up/Down counter 325 controlling the digital-to-analog converter 330 needs to have a programmable increment and decrement value of 1, 2, 4 or 8 least significant bits. Currently, designs incorporate a nine bit counter with a 500 ps delay range. This is used to control the gain of the loop, which in turn impacts loop stability.

Not shown is a gain adjust for each of the digital-to-analog converters 330 for all channels of the automated test equipment system. The gain adjust modifies the output signal of the digital-to-analog converters 330 such that the delay range of the delay element 335 matches to 5% or better across all the input channels of the automated test equipment system. This is desirable in instances where the separate reference clock is transmitted from the DUT and several input channels must follow the separate reference clock reference channel. The increment input signals 512 and the decrement input signals 514 being sent to the slave channels following the transitions of the separate reference clock need to move the track point by the same amount as the reference channel receiving the separate reference clock (within 5%).

It should be noted that in order to reduce bandwidth requirement of the captured digital response signal 345, the increment output signals 522 and decrement output signals 524 are encoded such that the transition, not the level, indicates the action. This effectively cuts the bandwidth requirement in half. Additionally, the response digital data signal capture circuit 540 does not generate the increment output 522 and decrement output 524 at the same time. In some of the embodiments of the present technology, the closest the increment output 522 and decrement output 524 can be is 2-4 ns apart depending on the size of the persistence Up/Down counter 325.

While this invention has been particularly shown and described with reference to the embodiments thereof, it will be understood by those skilled in the art that various changes in form and details may be made without departing from the spirit and scope of the invention.

What is claimed is:

1. A digital data signal capture circuit for synchronization of a received high frequency digital data signal, the digital data signal capture circuit comprising:
   a) a transition detector comprising:
      1) a digital data signal sampler capable of sampling and holding a received digital data signal at a first time, a second time, and a third time; and
      2) an early/late transition detector in communication with the digital data signal sampler, the early/late transition detector being constructed to receive samples of the received digital data signal at the first time, the second time, and the third time and from the received samples determine if a state transition occurs between the first time and the second time and if the state transition occurs between the first time and the third time and generate increment and decrement transition signals based on whether the state transition occurs between the first time and the second time and whether the state transition occurs between the first time and the third time;
   b) a strobe adjustment circuit coupled within the digital data signal capture circuit and configured so as to generate a strobe signal based on the increment and decrement transition signals from the early/late transition detector; and
   c) a capture circuit constructed to capture the received digital data signal using the strobe signal,
   wherein the digital data signal sampler comprises a clock generator to generate a first timing signal and a second timing signal, wherein the first timing signal has a phase difference of approximately 90° from the second timing signal, and wherein the digital data signal sampler is configured to use the first and second timing signals to sample and hold the received digital data signal at the first time, the second time, and the third times,
   wherein the digital data signal sampler further comprises:
   A) a first tracking flip flop configured to capture and retain the received digital data signal at the first time and at the third time
   B) a second tracking flip flop configured to capture and retain the received digital data signal at the second time; and
   C) a third tracking flip flop in communication with the first tracking flip flop and configured to receive the received digital data signal captured at the first time for storage until the third time, and
   wherein the clock generator is connected to provide the first timing signal at the first time and the third time to the first flip flop to capture and retain the received digital data signal and wherein the clock generator is connected to provide the first timing signal to the third flip flop to receive the received digital data signal captured at the first time for storage until the third time, and wherein the clock generator is connected to provide the second timing signal to the second flip flop at the second time to capture and retain the received digital data signal at the second time.

2. The digital data signal capture circuit of claim 1, further comprising an OR tree circuit coupled between the early/late transition detector and the strobe adjustment circuit, and wherein the strobe adjustment circuit is configured to generate the strobe signal based on increment and decrement strobe signals from the OR tree circuit.

3. The digital data signal capture circuit of claim 2, wherein the capture circuit is in communication with a variable delay element to receive the strobe signal from the variable delay element.

4. The digital data signal capture circuit of claim 1 further comprising a tracker controller in communication with a pattern generator to receive a tracker control signal and in communication with the transition detector and the strobe adjustment circuit to position the strobe signal as a function of the tracker control signal.

5. A digital data signal capture circuit for synchronization of a received high frequency digital data signal, the digital data signal capture circuit comprising:
   a) a transition detector comprising:
      1) a digital data signal sampler capable of sampling and holding a received digital data signal at a first time, a second time, and a third time; and
      2) an early/late transition detector in communication with the digital data signal sampler, the early/late transition detector being constructed to receive samples of the received digital data signal at the first time, the second time, and the third time and from the received samples determine if a state transition occurs between the first time and the second time and if the state transition occurs between the first time and the third time and generate increment and decrement transition signals based on whether the state transition occurs between the first time and the second time and whether the state transition occurs between the first time and the third time;
   b) a strobe adjustment circuit coupled within the digital data capture circuit and configured so as to generate a strobe signal based on the increment and decrement transition signals from the early/late transition detector; and
   c) a capture circuit constructed to capture the digital data signal using the strobe signal,
   wherein the digital data signal sampler comprises:
      (i) a first tracking flip flop configured to capture and retain the received digital data signal at the first time and at the third time;
      (ii) a second tracking flip flop configured to capture and retain the received digital data signal at the second time; and
      (iii) a third tracking flip flop in communication with the first tracking flip flop and configured to receive the received digital data signal captured at the first time for storage until the third time, and
   wherein the early/late transition detector comprises a first comparison circuit in communication with the second and third tracking flip flops to generate a transition occurrence signal to indicate that the state transition occurred between the first time and the second time to generate the decrement transition signal.

6. The digital data signal capture circuit of claim 5, wherein the early/late transition detector further comprises:
   i) a second comparison circuit in communication with the first and third tracking flip flops to indicate that the state transition occurred between the first time and the third time; and
   ii) a logic circuit in communication with the first and second comparison circuits to generate the increment transition signal.

7. A digital data signal capture circuit for synchronization of a received high frequency digital data signal, the digital data signal capture circuit comprising:
   a) a transition detector comprising:

1) a digital data signal sampler capable of sampling and holding a received digital data signal at a first time, a second time, and a third time; and
2) an early/late transition detector in communication with the digital data signal sampler, the early/late transition detector being constructed to receive samples of the received digital data signal at the first time, the second time, and the third time and from the received samples determine if a state transition occurs between the first time and the second time and if the state transition occurs between the first time and the third time and generate increment and decrement transition signals based on whether the state transition occurs between the first time and the second time and whether the state transition occurs between the first time and the third time;
b) a strobe adjustment circuit coupled within the digital data signal capture circuit and configured so as to generate a strobe signal based on the increment and decrement transition signals from the early/late transition detector; and
c) a capture circuit constructed to capture the received digital data signal using the strobe signal,
wherein the digital data signal sampler comprises a clock generator to generate a first timing signal and a second timing signal, wherein the first timing signal has a phase difference of approximately 90° from the second timing signal, and wherein the digital data signal sampler is configured to use the first and second timing signals to sample and hold the received digital data signal at the first time, the second time, and the third times,
further comprising an OR tree circuit coupled between the early/late transition detector and the strobe adjustment circuit, and wherein the strobe adjustment circuit is configured to generate the strobe signal based on increment and decrement strobe signals from the OR tree circuit, and
wherein the strobe adjustment circuit comprises:
A) a persistence up/down counter coupled to receive the increment and decrement strobe signals;
B) a digital-to-analog converter in communication with the persistence up/down counter; and
C) a variable delay element in communication with the digital-to-analog converter to adjust a master oscillator strobe signal to generate the strobe signal based on an output of the digital-to-analog converter.

8. The digital data signal capture circuit of claim 7, wherein the OR tree circuit is coupled between the transition detector and the persistence up/down counter so as to receive the increment and decrement transition signals from the early/late transition detector for a set number of clock cycles per cycle of the received digital data signal to inhibit oscillation in the digital data signal capture circuit.

9. The digital data signal capture circuit of claim 7, wherein the persistence up/down counter is a programmable multiple bit counter adjusted to limit a repetition rate of the received digital data signal.

10. A digital data signal capture circuit for synchronization of a received high frequency digital data signal, the digital data signal comprising:
a) a transition detector comprising:
1) a digital data signal sampler capable of sampling and holding a received digital data signal at a first time, a second time, and a third time; and
2) an early/late transition detector in communication with the digital data signal sampler, the early/late transition detector being constructed to receive samples of the received digital data signal at the first time, the second time, and the third time and from the received samples determine if a state transition occurs between the first time and the second time and if the state transition occurs between the first time and the third time and generate increment and decrement transition signals based on whether the state transition occurs between the first time and the second time and whether the state transition occurs between the first time and the third time;
b) a strobe adjustment circuit coupled within the digital data signal capture circuit and configured so as to generate a strobe signal based on the increment and decrement transition signals from the early/late transition detector; and
c) a capture circuit constructed to capture the received digital data signal using the strobe signal,
wherein the digital data signal sampler comprises a clock generator to generate a first timing signal and a second timing signal, wherein the first timing signal has a phase difference of approximately 90° from the second timing signal, and wherein the digital data signal sampler is configured to use the first and second timing signals to sample and hold the received digital data signal at the first time, the second time, and the third times,
further comprising an OR tree circuit coupled between the early/late transition detector and the strobe adjustment circuit, and wherein the strobe adjustment circuit is configured to generate the strobe signal based on increment and decrement strobe signals from the OR tree circuit,
wherein the OR tree circuit comprises:
a) an increment branch connected to receive increment transition signals from the early/late transition detector, the increment branch comprising:
1) a plurality of serially connected flip-flops having outputs in communication with an increment OR circuit;
2) an increment flip-flop having an input in communication with an output of the increment OR circuit, the increment flip-flop having a clock signal input in communication with a divided clock signal and having an output in communication with an increment input of the persistence up/down counter; and
b) a decrement branch connected to receive decrement transition signals from the early/late transition detector and provide a decrement signal to the persistence up/down counter, the decrement branch comprising:
1) a plurality of serially connected flip-flops having outputs coupled to a decrement OR circuit; and
2) a decrement flip-flop in communication with an output of the decrement OR circuit, the decrement flip-flop having a clock signal input in communication with the divided clock signal and having an output in communication with a decrement input of the persistence up/down counter.

11. The digital data signal capture circuit of claim 10, wherein a non-inverting output of the increment flip-flop and an inverting output of the decrement flip flop are coupled to an increment branch AND gate, and wherein a non-inverting output of the decrement flip-flop and an inverting output of the increment flip flop are coupled to a decrement branch AND gate, the increment branch AND gate and the decrement branch AND gate being coupled to the persistence up/down counter.

12. An automated test equipment system comprising:
a) a plurality of digital data signal capture circuits for synchronizing received digital data signals from a plurality of channels in communication with a device-under-test, each of the digital data signal capture circuits comprising:
1) a transition detector comprising:
    i) a digital data signal sampler capable of sampling and holding a received digital data signal at a first time, a second time, and a third time; and
    ii) an early/late transition detector in communication with the digital data signal sampler, the early/late transition detector being constructed to receive samples of the received digital data signal at the first time, second time, and the third time and from the received samples determine if a state transition occurs between the first time and the second time and if the state transition occurs between the first time and the third time and generate increment and decrement transition signals based on whether the state transition occurs between the first time and the second time and whether the state transition occurs between the first time and the third time;
2) an OR tree circuit coupled to the early/late transition detector;
3) a strobe adjustment circuit coupled to the OR tree circuit, the strobe adjustment circuit being configured to generate a strobe signal based on increment and decrement strobe signals from the OR tree circuit; and
4) a capture circuit constructed to capture the digital data signal using the strobe signal,
wherein the digital data signal sampler comprises a clock generator that generates a first timing signal and a second timing signal, wherein the first timing signal has a phase difference of approximately 90° from the second timing signal, and wherein the digital data signal sampler is configured to use the first and second timing signals to sample and hold the received digital data signal at the first time, the second time, and the third time,
wherein the digital data signal sampler further comprises:
a) a first tracking flip flop to capture and retain the received digital data signal at the first time and at the third time;
b) a second tracking flip flop to capture and retain the received digital data signal at the second time; and
c) a third tracking flip flop in communication with the first tracking flip flop to receive the received digital data signal captured at the first time for storage until the third time,
wherein the clock generator is connected to provide the first timing signal at the first time and the third time to the first tracking flip flop to capture and retain the received digital data signal and wherein the clock generator is connected to provide the first timing signal to the third flip flop to receive the received digital data signal captured at the first time for storage until the third time, and wherein the clock generator is connected to provide the second timing signal to the second flip flop at the second time to capture and retain the received digital data signal at the second time.

13. The automated test equipment system of claim 12, wherein each of the digital data signal capture circuits further comprises a tracker control unit in communication with a pattern generator to receive a tracker control signal and in communication with the transition detector and the strobe adjustment circuit to position the strobe signal as a function of the tracker control signal.

14. The automated test equipment system of claim 12, wherein each of the digital data signal capture circuits further comprises an increment/decrement selector circuit in communication with all the plurality of digital data signal capture circuits for incrementing or decrementing a persistence counter based on a state of a selection signal.

15. An automated test equipment system comprising:
a) a plurality of digital data signal capture circuits for synchronizing received digital data signals from a plurality of channels in communication with a device-under-test, each of the digital data signal capture circuits comprising:
    1) a transition detector comprising:
        i) a digital data signal sampler capable of sampling and holding a received digital data signal at a first time, a second time, and a third time; and
        ii) an early/late transition detector in communication with the digital data signal sampler, the early/late transition detector being constructed to receive samples of the received digital data signal at the first time, the second time, and the third time and from the received samples determine if a state transition occurs between the first time and the second time and if the state transition occurs between the first time and the third time and generate increment and decrement transition signals based on whether the state transition occurs between the first time and the second time and whether the state transition occurs between the first time and the third time;
    2) an OR tree circuit coupled to the early/late transition detector;
    3) a strobe adjustment circuit coupled to the OR tree circuit, the strobe adjustment circuit being configured to generate a strobe signal based on increment and decrement strobe signals from the OR tree circuit; and
    4) a capture circuit constructed to capture the digital data signal using the strobe signal,
wherein the digital data signal sampler comprises:
    (A) a first tracking flip flop configured to capture and retain the received digital data signal at the first time and at the third time;
    (B) a second tracking flip flop configured to capture and retain the received digital data signal at the second time; and
    (C) a third tracking flip flop in communication with the first tracking flip flop and configured to receive the received digital data signal captured at the first time for storage until the third time,
wherein the digital data signal sampler further comprises a clock generator that generates a first timing signal and a second timing signal, wherein the first timing signal has a phase difference of approximately 90° from the second timing signal, and wherein the clock generator is connected to provide the first timing signal at the first time and the third time to the first tracking flip flop to capture and retain the received digital data signal and wherein the clock generator is connected to provide the first timing signal to the third tracking flip flop to receive the received digital data signal captured at the first time for storage until the third time, and wherein the clock generator is connected to provide the second timing signal to the second flip flop at the second time to capture and retain the received digital data signal at the second time,
wherein the early/late transition detector comprises a first comparison circuit in communication with the second and third tracking flip flops to generate a transition occurrence signal to indicate that the state transition occurred between the first time and the second time to generate the decrement transition signal.

16. The automated test equipment system of claim 15, wherein the early/late transition detector further comprises:

A) a second comparison circuit in communication with the first and third tracking flip flops to indicate that the state transition occurred between the first time and the third time; and B) a logic circuit in communication with the first and second comparison circuits to generate the increment transition signal.

17. The automated test equipment system of claim 16, wherein the strobe adjustment circuit comprises:
1) a persistence up/down counter coupled to receive the increment and decrement strobe signals;
2) a digital-to-analog converter in communication with the persistence up/down counter; and
3) a variable delay element in communication with the digital-to-analog converter to adjust a master oscillator strobe signal to generate the strobe signal based on an output of the digital-to-analog converter.

18. The automated test equipment system of claim 17, wherein the capture circuit is in communication with the variable delay element to receive the strobe signal from the variable delay element.

19. The automated test equipment system of claim 17, wherein the OR tree circuit is coupled between the transition detector and the persistence up/down counter so as to receive the increment and decrement transition signals from the early/late transition detector for a set number of clock cycles per cycle of the received digital data signal to inhibit oscillation in the digital data signal capture circuit.

20. The automated test equipment system of claim 17, wherein the persistence up/down counter is a programmable multiple bit counter adjusted to limit a repetition rate of the received digital data signal.

21. An automated test equipment system comprising:
a) a plurality of digital data signal capture circuits for synchronizing received digital data signals from a plurality of channels in communication with a device-under-test, each of the digital data signal capture circuits comprising:
1) a transition detector comprising:
i) a digital data signal sampler capable of sampling and holding a received digital data signal at a first time, a second time, and a third time; and
ii) an early/late transition detector in communication with the digital data signal sampler, the early/late transition detector being constructed to receive samples of the received digital data signal at the first time, second time, and the third time and from the received samples determine if a state transition occurs between the first time and the second time and if the state transition occurs between the first time and the third time and generate increment and decrement transition signals based on whether the state transition occurs between the first time and the second time and whether the state transition occurs between the first time and the third time;
2) an OR tree circuit coupled to the early/late transition detector;
3) a strobe adjustment circuit coupled to the OR tree circuit, the strobe adjustment circuit being configured to generate a strobe signal based on increment and decrement strobe signals from the OR tree circuit; and
4) a capture circuit constructed to capture the digital data signal using the strobe signal,
wherein the digital data signal sampler comprises a clock generator that generates a first timing signal and a second timing signal, wherein the first timing signal has a phase difference of approximately 90° from the second timing signal, and wherein the digital data signal sampler is configured to use the first and second timing signals to sample and hold the received digital data signal at the first time, the second time, and the third time,
wherein each of the digital data signal capture circuits further comprises an increment/decrement selector circuit in communication with all the plurality of digital data signal capture circuits for incrementing or decrementing a persistence counter based on a state of a selection signal,
wherein the increment/decrement selector circuit is further in communication with a shmooing generator within a tester control unit for incrementing or decrementing to adjust the strobe signal.

22. A digital data signal capture method for synchronization of received digital data signals, the method comprising:
a) detecting transitions of a received digital data signal, wherein detecting the transitions comprises:
1) sampling and holding the received digital data signal at a first time, a second time, and a third time;
2) determining whether a state transition occurs between the first time and the second time or between the first time and the third time; and
3) generating one of an increment transition signal or a decrement transition signal to provide an indication of a position of the state transition between the first time and the second time or between the second time and the third;
b) adjusting a strobe signal based on the one of the increment transition signal or the decrement transition signal; and
c) capturing a digital data signal state value of the received digital data signal using the strobe signal,
wherein sampling the received digital data signal at the first time, the second time, and the third time comprises:
(i) generating a first timing signal and a second timing signal, wherein the first timing signal has a phase difference of approximately 90° from the second timing signal;
(ii) providing the first timing signal to a sample circuit at the first time and the third time to capture and retain the received digital data signal and to receive the received digital data signal captured at the first time for storage until the third time; and
(iii) providing the second timing signal to the sample circuit at the second time to capture and retain the received digital data signal at the second time.

23. The method of claim 22, further comprising providing the one of the increment transition signal or the decrement transition signal to an OR tree and adjusting the strobe signal based on increment and decrement strobe signals from the OR tree.

24. The method of claim 23, wherein adjusting the strobe signal based on increment and decrement strobe signals from the OR tree comprises providing the increment and decrement strobe signals of the OR tree to a persistence counter and the output of the persistence counter to a delay circuit to adjust the strobe signal.

25. The method of claim 24, wherein the OR tree receives one of the increment transition signal or the decrement transition signal for a set number of clock cycles per cycle of the received digital data signal to inhibit oscillation in a digital data signal capture circuit performing the digital data signal capture method.

26. The method of claim 22, wherein adjusting the strobe signal comprises synchronizing the strobe signal with the received digital data signal such that a digital data signal state value is detected midway between jitter bands of the received digital data signal.

27. A method for automatically testing electronic circuitry comprising:
 a) capturing and synchronizing received digital data signals from a plurality of channels in communication with a device-under-test comprising:
  1) detecting transitions of a received digital data signal, wherein detecting the transitions comprises:
   i) sampling and holding the received digital data signal at a first time, a second time, and a third time;
   ii) determining whether a state transition occurs between the first time and the second time and between the first time and the third time; and
   iii) generating one of an increment transition signal or a decrement transition signal to provide an indication of a position of the state transition between the first time and the second time or between the second time and the third;
  2) providing the one of the increment transition signal or the decrement transition signal to an OR tree;
  3) adjusting a strobe signal based on at least one of an increment and decrement strobe signal of the OR tree; and
  4) capturing a digital data signal state value of the received digital data signal using the strobe signal, wherein sampling the received digital data signal at the first time, the second time, and the third time comprises:
   (A) generating a first timing signal and a second timing signal, wherein the first timing signal has a phase difference of approximately 90° from the second timing signal;
   (B) providing the first timing signal to a sample circuit at the first time and the third time to capture and retain the received digital data signal and to receive the received digital data signal captured at the first time for storage until the third time; and
   (C) providing the second timing signal to the sample circuit at the second time to capture and retain the received digital data signal at the second time.

28. The method of claim 27 further comprising:
 b) shmooing the strobe signal by adjusting the strobe signal by a predetermined amount and determining pattern sensitivity of the received digital data signals; and
 c) selecting between detecting transitions of the received digital data signals and the shmooing of the strobe signal based on a state of a selection signal.

29. The method of claim 27, wherein adjusting a strobe signal based on at least one of the increment and decrement strobe signal from the OR tree comprises providing increment and decrement strobe signals from the OR tree to a persistence counter and the output of the persistence counter to a delay circuit to adjust the strobe signal.

* * * * *

UNITED STATES PATENT AND TRADEMARK OFFICE
CERTIFICATE OF CORRECTION

| | | |
|---|---|---|
| PATENT NO. | : 8,094,766 B2 | Page 1 of 1 |
| APPLICATION NO. | : 12/167073 | |
| DATED | : January 10, 2012 | |
| INVENTOR(S) | : George W. Conner | |

It is certified that error appears in the above-identified patent and that said Letters Patent is hereby corrected as shown below:

In column 13, line 39, in Claim 1, delete "third times," and insert -- third time, --.

In column 13, line 43, in Claim 1, delete "time" and insert -- time; --.

In column 15, line 31, in Claim 7, delete "third times," and insert -- third time, --.

In column 15, line 60, in Claim 10, delete "signal comprising:" and insert -- signal capture circuit comprising: --.

In column 16, line 26, in Claim 10, delete "third times," and insert -- third time, --.

In column 20, line 29, in Claim 22, delete "third;" and insert -- third time; --.

In column 21, line 21, in Claim 27, delete "third;" and insert -- third time; --.

Signed and Sealed this
Sixth Day of March, 2012

David J. Kappos
*Director of the United States Patent and Trademark Office*